United States Patent
Joshi et al.

(10) Patent No.: US 10,996,247 B2
(45) Date of Patent: May 4, 2021

(54) VOLT-VAR DEVICE MONITOR

(71) Applicant: LANDIS+GYR INNOVATIONS, INC., Alpharetta, GA (US)

(72) Inventors: Vivek Joshi, Alpharetta, GA (US); Ashwin Shirsat, Atlanta, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 267 days.

(21) Appl. No.: 16/009,492

(22) Filed: Jun. 15, 2018

(65) Prior Publication Data

US 2019/0383864 A1 Dec. 19, 2019

(51) Int. Cl.
*G01R 19/25* (2006.01)
*H01J 13/00* (2006.01)
*H02J 13/00* (2006.01)

(52) U.S. Cl.
CPC ...... *G01R 19/2513* (2013.01); *H02J 13/0006* (2013.01)

(58) Field of Classification Search
CPC .................. G01R 19/2513; H02J 13/0006
See application file for complete search history.

(56) References Cited

U.S. PATENT DOCUMENTS

| 8,283,903 | B2* | 10/2012 | Feng | H02J 3/1828 |
| | | | | 323/255 |
| 8,588,993 | B2* | 11/2013 | Feng | H02J 3/00 |
| | | | | 700/298 |
| 8,892,375 | B2* | 11/2014 | Taft | G01D 4/002 |
| | | | | 702/58 |
| 8,933,585 | B2* | 1/2015 | Bell | G01R 21/00 |
| | | | | 307/31 |
| 9,014,867 | B2 | 4/2015 | Divan et al. | |
| 9,166,408 | B2* | 10/2015 | Schmid | H02J 13/00034 |
| 9,282,383 | B2* | 3/2016 | Carr | H04Q 9/00 |
| 9,287,711 | B2* | 3/2016 | Schmid | H02J 3/1828 |

(Continued)

OTHER PUBLICATIONS

Jouni et al. Leveraging AMI Data for Distribution System Model Calibration and Situational Awareness (Year: 2015).*

(Continued)

*Primary Examiner* — Mohammad K Islam
(74) *Attorney, Agent, or Firm* — Kilpatrick Townsend & Stockton LLP

(57) ABSTRACT

Certain aspects and features include a system and method for monitoring the operational status of assets in an electric power distribution system. For example, an asset monitoring system identifies a zone of operation for an asset under evaluation. The asset monitoring application identifies meters connected to transformers in the zone of operation and obtains meter voltages for the meters over multiple intervals. The asset monitoring application determines a primary voltage for at least one transformer based on at least one meter voltage. The asset monitoring application uses the primary voltage in a power flow calculation to estimate an operational setting for the asset. The asset monitoring application compares the voltages from the power flow analysis using the estimated operational setting and the voltages from the meter voltages across multiple time intervals. Based on the comparison, the asset monitoring application determines an operational status of the asset.

11 Claims, 13 Drawing Sheets

(56) References Cited

U.S. PATENT DOCUMENTS

| | | | |
|---|---|---|---|
| 9,582,020 B2 | 2/2017 | Powell et al. | |
| 9,829,899 B2* | 11/2017 | Handley | G05F 1/00 |
| 9,847,644 B2* | 12/2017 | Muller | H02J 3/383 |
| 9,960,637 B2* | 5/2018 | Sanders | H02J 15/00 |
| 10,135,247 B2* | 11/2018 | Fisher | H02J 3/16 |
| 10,139,800 B2* | 11/2018 | Dhople | H02J 3/18 |
| 10,230,239 B2* | 3/2019 | Feng | G06G 7/635 |
| 10,541,724 B2* | 1/2020 | Martin | H04L 41/083 |
| 10,585,445 B2* | 3/2020 | Wong | G05F 1/66 |
| 10,734,838 B2* | 8/2020 | Roytelman | H02J 3/14 |
| 2012/0022713 A1 | 1/2012 | Deaver, Sr. et al. | |
| 2012/0182157 A1* | 7/2012 | Carr | H04Q 9/00 |
| | | | 340/870.02 |
| 2015/0112496 A1* | 4/2015 | Fisher | H02J 3/16 |
| | | | 700/291 |
| 2020/0067312 A1* | 2/2020 | Pavlovski | H02J 3/004 |
| 2020/0280263 A1* | 9/2020 | Lin | H02M 3/33592 |

OTHER PUBLICATIONS

PCT Patent Application No. PCT/US2019/036648, Invitation to Pay Additional Fees and, Where Applicable, Protest Fee, Nov. 6, 2019, 15 pages.

Triplett et al., "Evaluating Distribution System Lossses Using Data from Deployed AMI and GIS Systems", In Rural Electric Power Conference (REPC), 2010 IEEE, 2010, 10 pages.

PCT Patent Application No. PCT/US2019/036648, International Search Report and Written Opinion, dated Jan. 20, 2020, 16 pages.

\* cited by examiner

VOLT-VAR DEVICE MONITOR

TECHNICAL FIELD

This invention relates to monitoring electrical power distribution systems. For example, aspects described herein use advanced metering data from endpoint devices to determine an operating status for assets on electrical power distribution systems.

BACKGROUND

Electricity is delivered through a distribution network that connects a generation system, e.g., a power generator and a transmission system, to end users such as consumers or businesses, using assets such as transformers, distribution lines, and capacitor banks. Due to the complex nature of a distribution system, faults can occur at different places on the system. An example of a fault is a malfunctioning device such as a transformer or capacitor bank. Faults can be caused by external factors, such as when a storm knocks down a power line or by internal factors, such as component failure.

But the existence of a fault is not easily detected. Moreover, the location of a fault within the distribution network is not easily diagnosed. Utility companies may not place measurement devices throughout the network. For example, a lack of power at a customer's premises could be caused anywhere in the distribution network, not necessarily at the end of the line. Household and other equipment is voltage sensitive and therefore can be damaged by over and under-voltages. But over-voltage and under-voltage fault conditions may be more subtle to diagnose and difficult to remedy.

In order to diagnose a fault, a crew of technicians typically travels to the affected areas to check the lines and assets. But because a fault can occur anywhere on the distribution system, and the location of the fault is not easy to diagnose, a technician traces the power line upstream as necessary to find the fault. This is a time-consuming and expensive process.

Other solutions include the placement of hardware monitoring devices at various locations on the distribution network. Such devices include a capability to communicate with a headend system to communicate problems. But given the complexity of the distribution system, such devices are unable to determine whether a problem exists, as more complete analysis that includes the properties of all the assets in the system must be performed. Moreover, placing devices in the field is expensive.

Hence, solutions are needed to more quickly and effectively diagnose the operational status of an electric resource distribution system without the addition of infrastructure in the field.

SUMMARY

Certain aspects and features include a system and method for monitoring an operational status of assets in an electric power distribution system. For example, an asset monitoring system identifies a zone of operation for an asset under evaluation. The asset monitoring application identifies multiple meters connected to transformers in the zone of operation. The asset monitoring application obtains meter voltages for the meters over multiple intervals. The asset monitoring application determines a primary voltage for at least one transformer based on at least one meter voltage. The asset monitoring application uses the primary voltage in a power flow optimization calculation to estimate an operational setting for the asset and compares the voltages from the power flow calculation using the estimated operational setting and the voltages from the meter voltages across multiple time intervals. Based on the comparison, the asset monitoring application determines an operational status of the asset.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Aspects of the present invention relate to using advanced metering devices installed at endpoint locations on an power distribution network to determine whether assets on the network are operating correctly. Examples of assets include capacitor banks, voltage regulators, and transformers.

Typical power distribution networks attempt to maintain a voltage delivered to an endpoint or customer premises using a variety of techniques. For example, power distribution networks use on-load tap-changing transformers (OLTCs) that can switch between transformer taps, thereby regulating the voltage, as the network load changes. Other assets are also used to maintain voltage downstream from OLTCs. For example, voltage regulators are used to increase the voltage and capacitor banks, typically installed in shunt with a distribution line, supply additional reactive power. The correct operation of such assets is therefore desirable. But assets typically lack self-diagnosing capability. As such, utility companies are unable to diagnose faults with such assets without sending a crew of technicians to the respective locations of the assets.

Aspects described herein use an asset-monitoring application executing on a computing device to determine the operating status of an asset. The asset-monitoring application uses voltage and power consumption data that originates from Advanced Metering Infrastructure (AMI) meters that are located at a customer's premises in conjunction with topographic information about the power distribution network, i.e., how the various assets, feeders, and distribution lines are connected. Topographic and other information can come from utility data such as GIS, AMI data, MDM data, or SCADA data.

More specifically, the asset-monitoring application compares a set of parameters derived from AMI measurements with a set of expected parameters derived from a power flow optimization calculation. A power flow optimization calculation considers fundamental characteristics (physical and electrical) of assets, network topology, and loading conditions. The expected parameters represent normal values under a load condition at a particular time. A comparison of expected parameters with parameters derived from AMI measurements provides detailed insights on operational status of the assets devices on an electrical distribution network.

Figure 1:
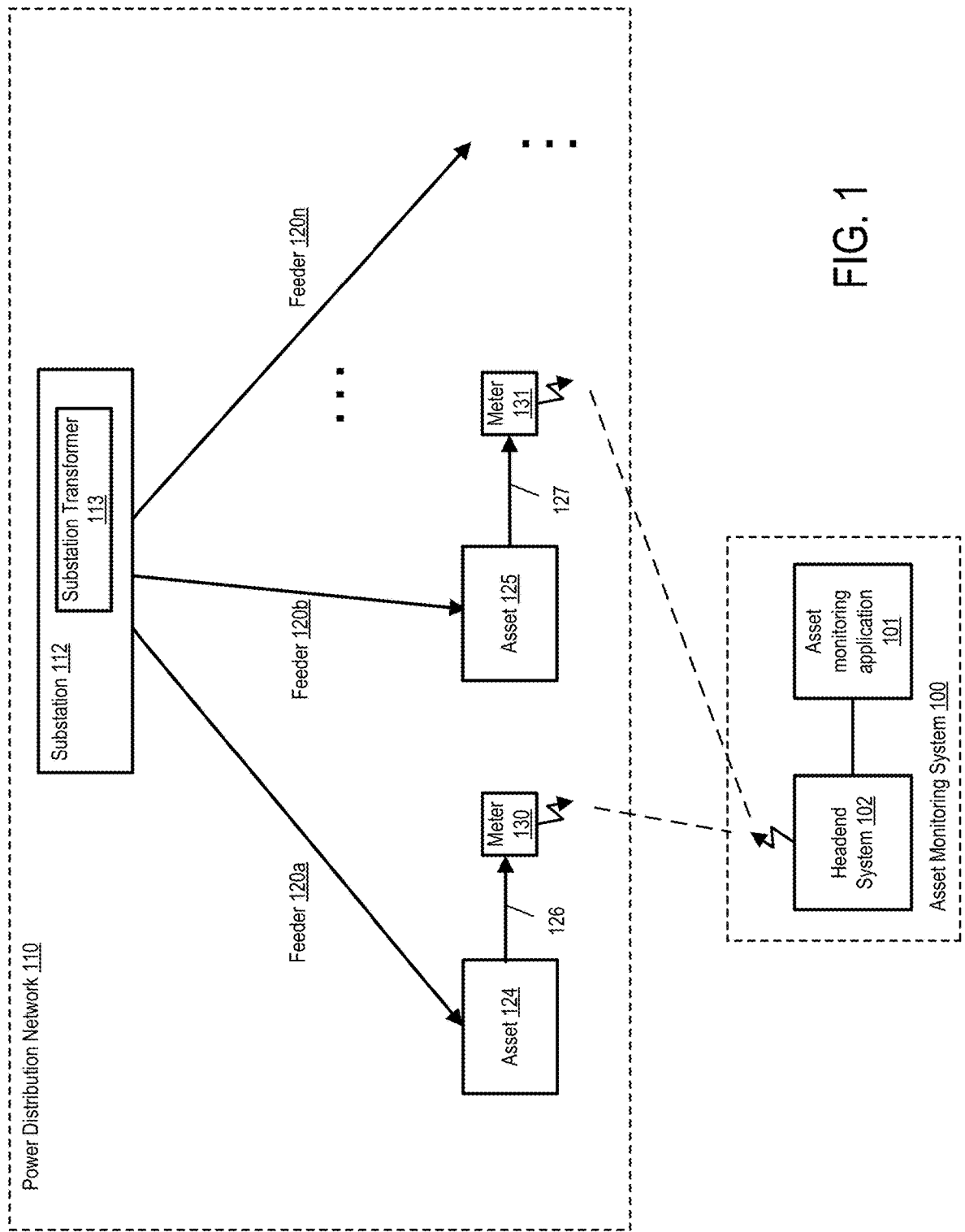
FIG. 1 illustrates an exemplary physical topology of a power distribution network showing devices at various points on the network.

FIG. 1 illustrates an exemplary physical topology of an power distribution network showing devices at various points, or nodes, on the network. FIG. 1 depicts asset monitoring system 100 and power distribution network 110. Asset monitoring system 100 receives information from endpoint meters in power distribution network 110 and determines the operational status assets on the power distribution network 110.

Figure 13:
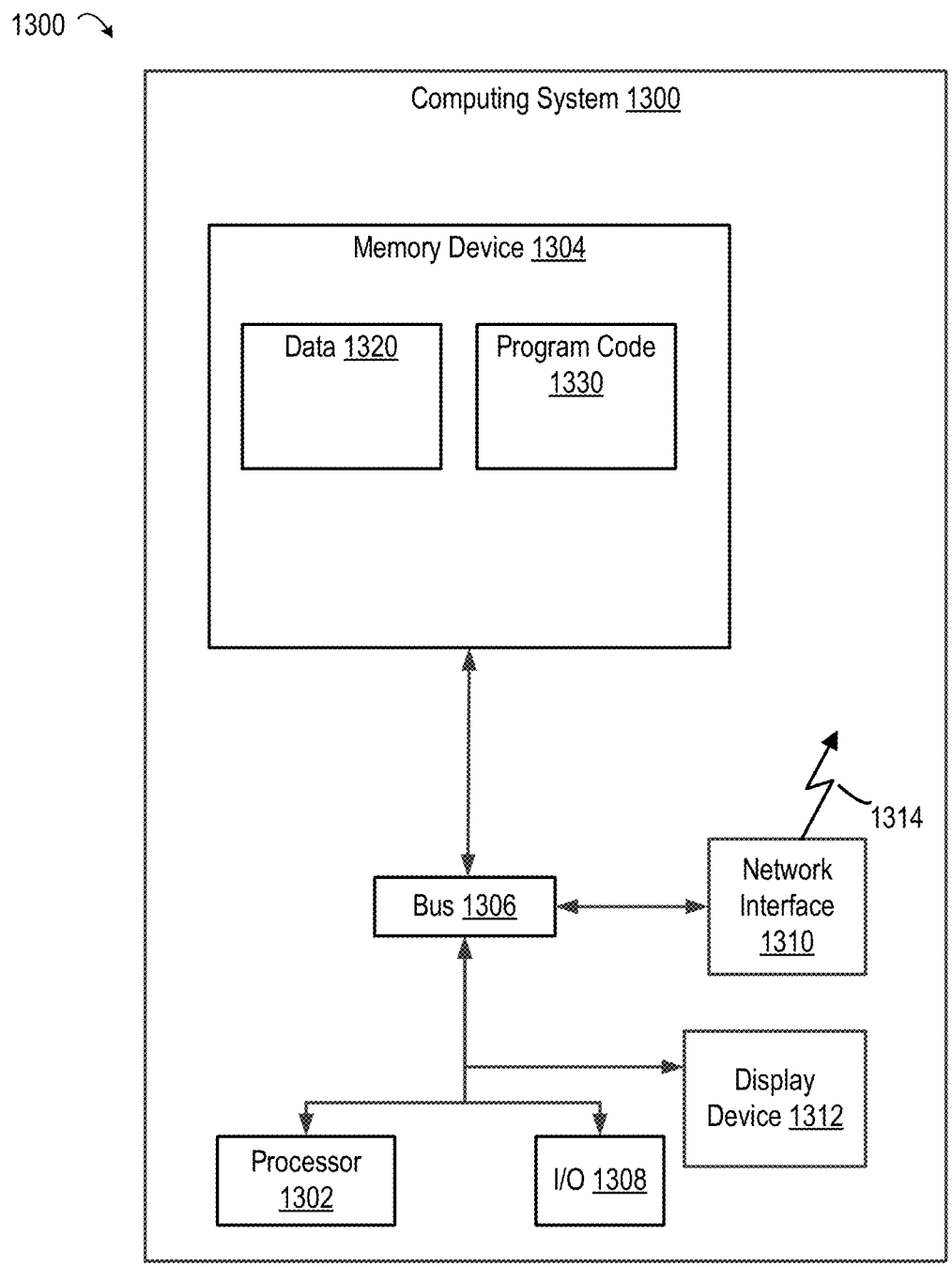
FIG. 13 illustrates an exemplary computing device used for an asset-monitoring application.

Asset monitoring system 100 includes asset monitoring application 101 and headend system 102. Asset monitoring application 101 executes on a computing device as depicted in FIG. 13. Asset monitoring application 101 can receive metering data such as voltage, power consumption, etc., from meters that are installed at customers' premises. In conjunction with network topology information, asset monitoring application 101 determines the operating status of assets within the power distribution network 110. Asset monitoring application 101 receives metering data from headend system 102 or through an intermediary that reads and aggregates metering information. The meters may communicate metering information to the headend system via additional network devices and networks, which are not shown in the figures for simplicity.

Power distribution network 110 includes substation 112 and one or more feeders 120a-n. Substation 112 distributes power received from an electricity source to feeders 120a-n. Examples of electricity sources are a coal plant, a wind turbine, or a solar panel installation. Substation 112 can include a substation transformer 113. Substation transformer 113 steps down a voltage input to the substation 112 and outputs a lower voltage to feeders 120a-n. Substation 112 can distribute multiple phases, e.g. three phases, of power.

Each feeder 120a-n has one or more assets such as asset 124 or asset 125. Assets provide power to lateral lines, or laterals. Power distribution network 110 includes lateral 126 connected to asset 124, and lateral 127 connected to asset 125. Assets 124 and 125 can be devices such as OTLCs, transformers, voltage regulators, or capacitor banks. In turn, lateral 126 provides power to meter 130 and lateral 127 provides power to meter 131.

Each asset performs a function on the distribution network. For example, transformers step down a voltage from the substation, for example, 10 kV, to a lower voltage, e.g., 240 V. Capacitor banks provide increased reactive power to endpoint nodes that are connected to a respective distribution line 122a-n. Voltage regulators ensure that voltages on lateral lines remain within a predefined range regardless of load.

The asset-monitoring application derives a set of parameters derived from AMI with a set of expected parameters derived from a power flow calculation. Methods used by the asset monitoring application vary by target asset. For example, the method used to determine the operation of a capacitor bank differs from the methods used to determine the operation of a distribution transformer. In an example, the asset monitoring application determines the condition of a particular target asset. To do so, the asset monitoring application determines assets and other equipment that are located on nodes within a zone of operation of the target asset. For example, if the target asset is a capacitor bank, then the asset monitoring application can consider parameters of transformers near or adjacent to the capacitor bank. To determine a primary voltage of a transformer, the asset monitoring application identifies one or more meters connected to transformers in the zone of operation. The asset monitoring application obtains a meter voltage for each meter, for example, by using Advanced Metering (AMI) Data from a smart meter. The asset monitoring application can do so for multiple time intervals, which can correspond to the intervals used for consumption measurements. The asset monitoring application determines a primary voltage for at least one transformer based on the one or more meter voltages.

The asset monitoring application additionally uses the transformer primary voltage in a power flow calculation in order to estimate an operational setting for the asset. For example, the primary voltage for a transformer located upstream of a voltage regulator and for another transformer located downstream of a transformer can be used to determine a tap setting of the voltage regulator. Similarly, such parameters can be used to determine a load condition or the status of a capacitor bank.

In this manner, the asset monitoring application can compare the power flow voltages and the voltages from the AMI data across multiple time intervals to detect an inconsistency or an abnormality that indicates the operational status of the asset.

Capacitor Bank

Figure 2:
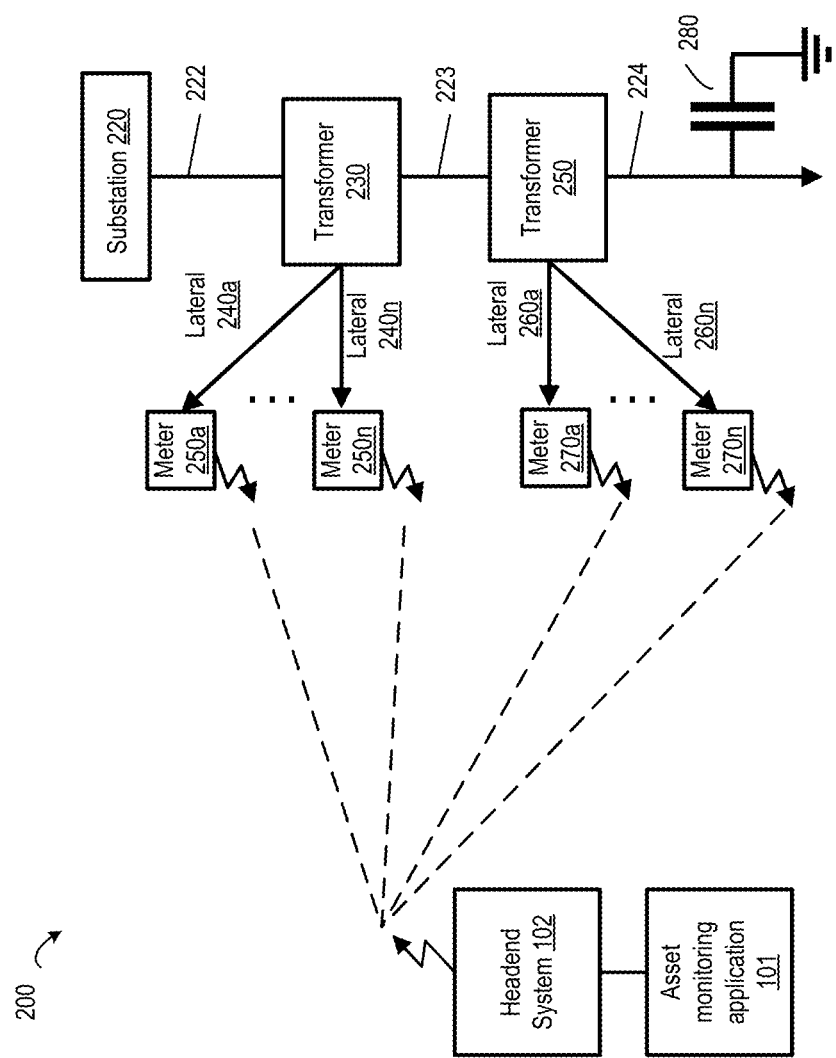
FIG. 2 illustrates an exemplary substation distribution line on a power distribution network that includes a capacitor bank.

Asset monitoring application 101 can determine the operating status of a capacitor bank. FIG. 2 illustrates an exemplary substation distribution line on a power distribution network that includes a capacitor bank. Substation environment 200 includes one or more of substation transformer 220, distribution lines 222-224, transformer 230, laterals 240a-n, meters 250a-n, transformer 250, laterals 260a-n, meters 270a-n, and capacitor bank 280.

Asset monitoring application 101 determines the operating status of capacitor bank 280 by analyzing topology information that indicates the configuration and location of assets, distribution lines, and meters on a distribution network, and data received from one or more meters on the network such as voltage, power consumption, and other data that originated from meters 250a-n and 270a-n.

Substation transformer 220 provides power, via distribution line 222, to transformer 230, via distribution lines 222 and 223 to transformer 250. Transformer 230 provides power via a secondary winding to laterals 240a-n. A typical lateral voltage is 120 Volt or 240 Volt. Each lateral 240a-n can have one or more meters such as meters 250a-n. Similarly, transformer 250 provides power via a secondary winding to laterals 260a-n. Each lateral 260a-n can have one or more meters 270a-n.

Asset monitoring application 101 can use voltage and power measurements from meters 250a-n and 270a-n to determine primary voltages of transformers 230 and 250 and subsequently the operation of capacitor bank 280. Because transformer 250 is located downstream from transformer 230, the primary voltage of transformer 250 may be different from the primary voltage of transformer 230. Accordingly, the primary voltages of both transformers 230 and 250 can together indicate how the voltage of distribution line 223 differs from the voltage of distribution line 222.

Capacitor bank 280 can be a fixed capacitor bank or a switched capacitor bank. Fixed capacitor banks lack the capability to be switched on or off, whereas switched capacitor banks can be switched on or off. Methods used for determining the operation of fixed capacitor banks and switched capacitor banks can differ. Exemplary processes are described in FIGS. 3 and 4.

Figure 3:
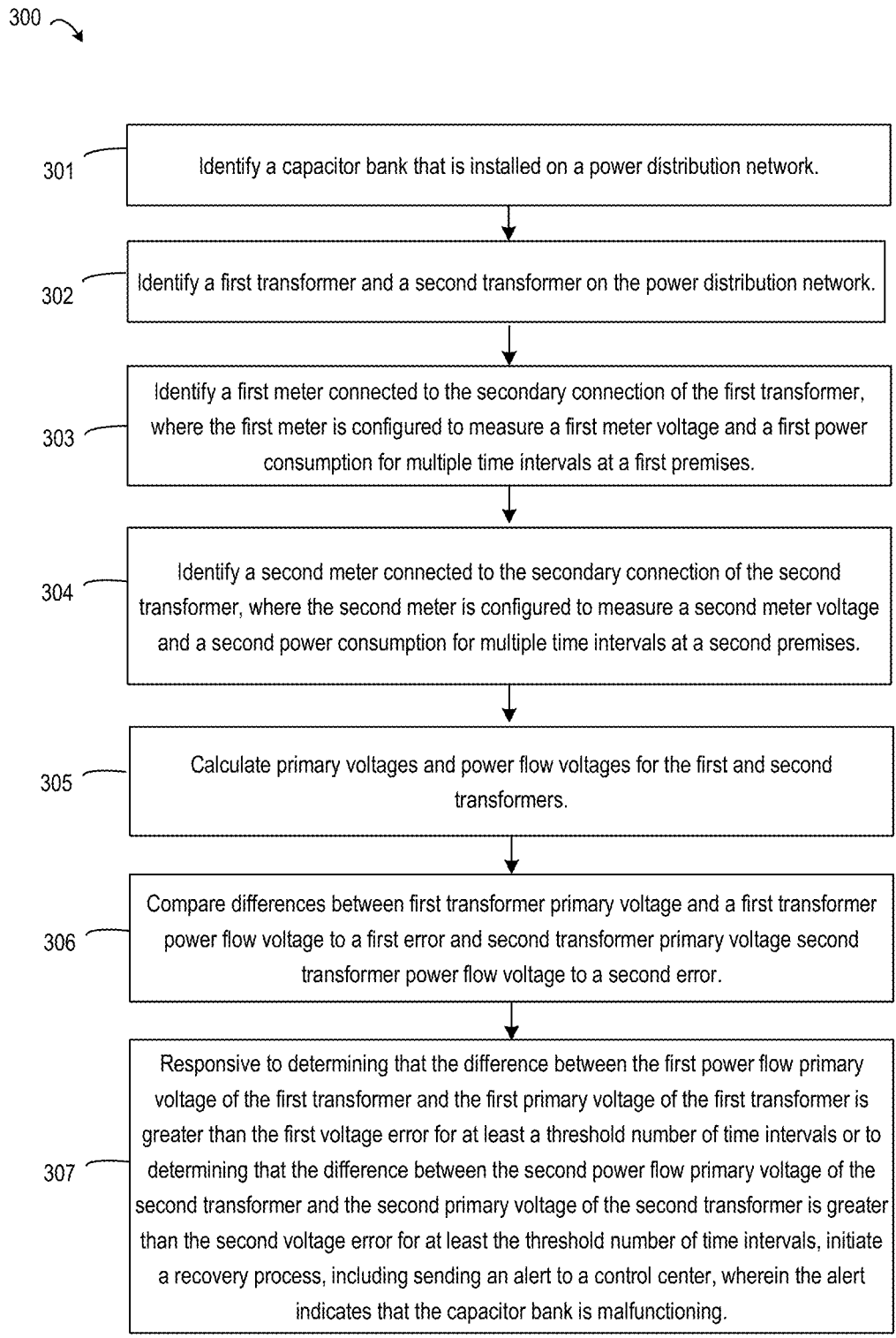
FIG. 3 is a flowchart illustrating an exemplary process for validating the operation of capacitor banks on an power distribution network.

FIG. 3 is a flowchart illustrating an exemplary process 300 for validating the operation of a fixed capacitor bank on a power distribution network. FIG. 3 is described with respect to the distribution network topology described in FIG. 2, i.e. substation environment 200, but process 300 can be applied to other distribution networks.

At block 301, asset monitoring application 101 identifies a capacitor bank that is installed on a power distribution network. For example, asset monitoring application 101 identifies capacitor bank 280 in substation environment 200. For a system that includes more than one capacitor bank, asset monitoring application 101 identifies each capacitor bank in a separate instance of process 300.

At block 302, asset monitoring application 101 identifies a first transformer and a second transformer on the power distribution network. Asset monitoring application 101 can optionally designate a zone of operation around capacitor bank 280. The zone of operation includes one or more assets that are close or adjacent to capacitor bank 280. For example, as depicted in substation environment 200, a zone of operation includes the transformers connected downstream from the substation transformer 220, but upstream from the capacitor bank 280. As can be seen in FIG. 2, transformer 230 is connected downstream from substation transformer 220, transformer 250 is connected downstream from transformer 230, and capacitor bank 280 is connected in shunt downstream from transformer 250.

At block 303, asset monitoring application 101 identifies a first meter connected to the secondary connection of the first transformer, where the first meter is configured to measure a first meter voltage and a first power consumption for multiple time intervals at a first premises. Meters can be advanced metering infrastructure (AMI) meters. Asset monitoring application 101 can use a network topology to determine which transformer provides power to a particular meter. Metering data, which includes voltage, power consumption, or other data, can be provided either directly to headend system 102, or through an intermediary such as a third party that reads and aggregates metering information.

For example, asset monitoring application 101 identifies meter 250a connected to the secondary winding of transformer 230 via lateral 240a. Meter 250a can measure voltage, power consumption, and other information over different periods of time and can provide this information to asset monitoring application 101. Asset monitoring application 101 can use different sources of information to identify meters. For example, asset monitoring application 101 can receive a network topology, GIS (geographic information system) data. Asset monitoring application 101 can determine the locations of different assets relative to each other by analyzing this data.

At block 304, asset monitoring application 101 identifies a second meter connected to the secondary connection of the second transformer. The second meter is configured to measure a second meter voltage and a second power consumption for multiple time intervals at a second premises.

Each transformer 230 and 250 has a primary and a secondary connection. The primary connection, or winding, represents the input to the transformer, which is typically the higher voltage. The secondary connection or winding represents the output from the transformer, which is typically the lower voltage.

For example, asset monitoring application 101 identifies meter 270a connected to the secondary winding of transformer 250 via lateral 260a. Meter 270a can measure voltage, power consumption, and other information over different periods of time and can provide this information to asset monitoring application 101.

At block 305, asset monitoring application 101 compares AMI parameters, e.g., primary voltages, with expected parameters, e.g., power flow voltages for the first and second transformers.

Asset monitoring application 101 determines primary transformer voltages from meter voltages by accounting for a voltage drop on a lateral, a voltage drop from the secondary winding of the transformer to the meter, and a voltage drop across the transformer itself according to winding ratios and loss. AMI parameters such as a primary voltage for the first transformer and a primary voltage for the second transformer represent values that are derived from actual measured AMI data.

Asset monitoring application 101 uses voltage data obtained from meter 250a to determine the primary voltage of transformer 230 and meter data from meter 270a to determine the primary voltage of transformer 250. Asset monitoring application 101 calculates lateral line drop, i.e., voltage drop, for each lateral 240a and 260a. Additionally, asset monitoring application 101 determines a rated transformer loss and primary to secondary winding ratios of the primary voltages of transformers 230 and 250. An exemplary method is described in the section below entitled calculation of primary transformer voltages using AMI meter data.

Asset monitoring application 101 additionally calculates primary power flow voltages for transformers 230 and 250.

At block 306, asset monitoring application 101 compare differences between first transformer primary voltage and a first transformer power flow voltage to a first error and second transformer primary voltage second transformer power flow voltage to a second error. Because the power flow represents an expected value given a current load and accurate asset operation, comparing such values to the primary voltages derived from AMI data provides insight into whether the network is operating as expected.

Accordingly, asset monitoring application 101 determines a difference between the first transformer, i.e., transformer 230, primary voltage and the first transformer power flow voltage and compares the difference to a first error range. Asset monitoring application 101 also determines a difference between the second transformer, i.e., transformer 250, primary voltage and the second transformer power flow voltage and compares the difference to a second error range.

The first and second error ranges represent ranges in which the differences are tolerated. The error ranges may be ranges around zero. If the measured differences between a primary voltage and a power flow voltage for a particular transformer are outside the respective error range, then asset monitoring application 101 may determine that the asset, in the current example, capacitor bank 280, is not operating correctly. The first and second errors may differ due to differing tolerances for error in the network.

At block 307, responsive to determining that the difference between the first power flow primary voltage of the first transformer and the first primary voltage of the first transformer is greater than the first voltage error for at least a threshold number of time intervals and to determining that the difference between the second power flow primary voltage of the second transformer and the second primary voltage of the second transformer is greater than the second voltage error for at least the threshold number of time intervals, asset monitoring application 101 initiates a recovery process.

The recovery process can take various forms. For example, asset monitoring application 101 can send an alert to a control center. The alert can indicate that the capacitor bank is malfunctioning or needs attention.

Asset monitoring application 101 determines whether an error condition exists by analyzing results over a certain amount of time or after a number of measured anomalies. An exemplary error condition may be if the difference between the first power flow primary voltage of the first transformer and the first primary voltage of the first transformer is greater than the first voltage error for at least a threshold number of time intervals. Another exemplary error condition is a difference between the second power flow primary voltage of the second transformer and the second primary voltage of the second transformer that is greater than the second voltage error for at least the threshold number of time intervals.

Responsive to determining that an error condition exists, asset monitoring application 101 can send an alarm or an alert. For example, the asset monitoring application can notify a headend system by an alert or create a log of the out-of-range condition. For example, a log can be maintained with events.

Switched Capacitor Bank

Asset monitoring application 101 can also determine the operational status of switched capacitor banks. Switched capacitor banks provide reactive power to the power distribution network and have the capability to be enabled or disabled. When disabled a capacitor bank has no effect on the parameters of the network. When enabled, the capacitor bank provides additional reactive power to the network.

Figure 4:
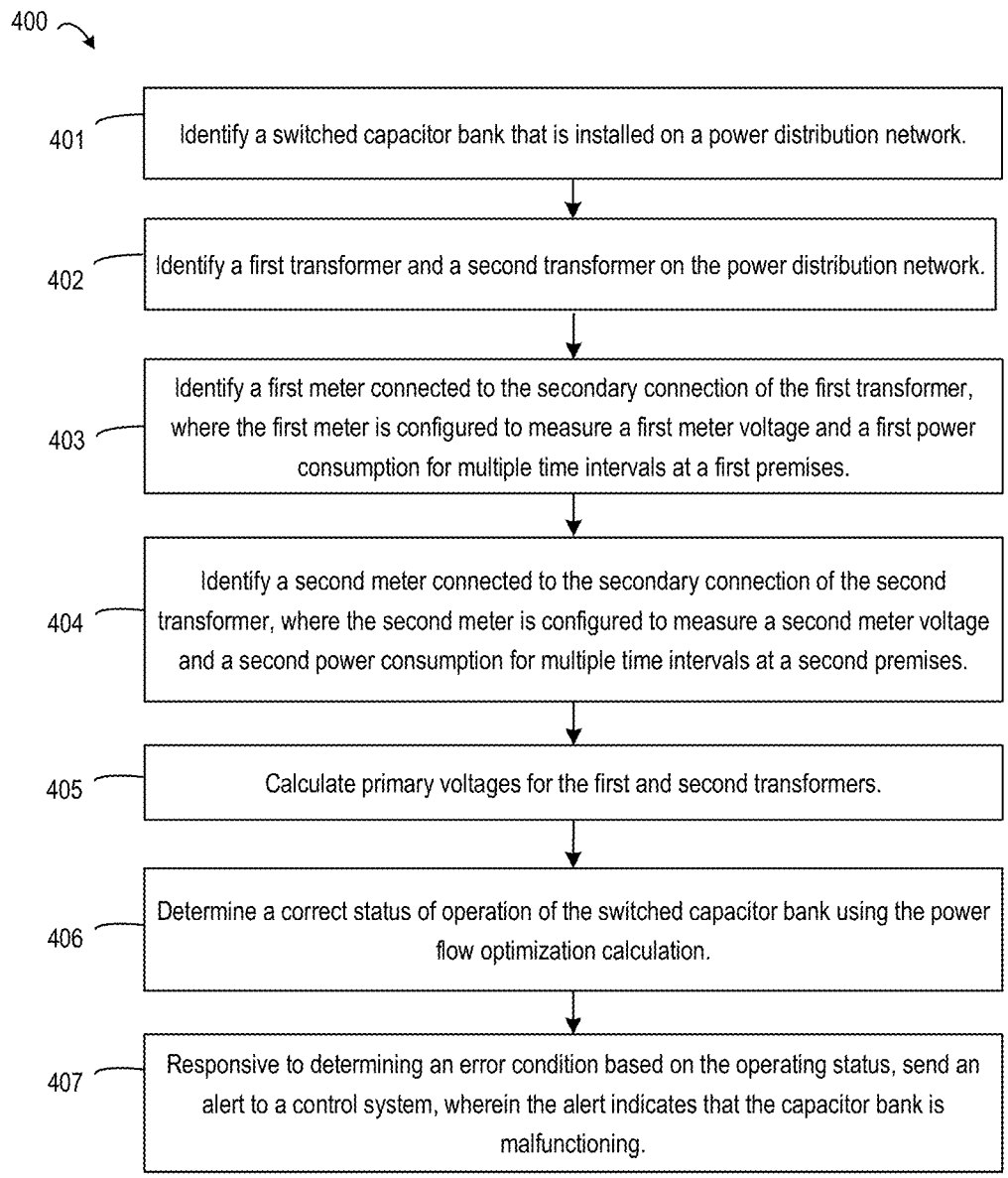
FIG. 4 is a flowchart illustrating an exemplary process for validating the operation of switched capacitor banks on an power distribution network.

For example, FIG. 4 is a flowchart illustrating an exemplary process 400 for validating the operation of a switched capacitor bank on a power distribution network.

At block 401, asset monitoring application 101 identifies a capacitor bank that is installed on a power distribution network in a substantially similar manner to the functions described with respect to block 301.

At block 402, asset monitoring application 101 identifies a first transformer and a second transformer on the power distribution network in a substantially similar manner to the functions described with respect to block 302.

At block 403, asset monitoring application 101 identifies a first meter connected to the secondary connection of the first transformer in a substantially similar manner to the functions described with respect to block 303.

At block 404, asset monitoring application 101 identifies a second meter connected to the secondary connection of the second transformer in a substantially similar manner to the functions described with respect to block 304.

At block 405, asset monitoring application 101 calculates primary voltages for the first and second transformers. AMI parameters such as a primary voltage for the first transformer and a primary voltage for the second transformer are values derived from measured AMI data. Asset monitoring application 101 determines primary voltages using the voltages measured at the endpoints, i.e., meters that connect to the transformers, and the topology of the network.

More specifically, asset monitoring application 101 uses voltage data obtained from meter 250a to determine the primary voltage of transformer 230 and meter data from meter 270a to determine the primary voltage of transformer 250. Asset monitoring application 101 calculates lateral line drop, i.e., voltage drop, for each lateral 240a and 260a. Additionally, asset monitoring application 101 determines a rated transformer loss and primary to secondary winding ratios of the primary voltages of transformers 230 and 250. An exemplary method is described in the section below entitled calculation of primary transformer voltages using AMI meter data.

At block 406, asset monitoring application 101 determines the correct status of the switched capacitor bank using a power flow optimization calculation. The correct operating status is whether the switched bank should be off or on based on the loading conditions at the time and switched capacitor bank control settings. Control settings can include time delay settings, controlled node location, or threshold values for triggering.

At block 407, responsive to determining an error condition based on the operating status, asset monitoring application 101 sends an alert to a control center, wherein the alert indicates that the capacitor bank is malfunctioning. Different error conditions are possible. Methods for determining an error condition differ in the case of a high load and a low load.

To determine the existence of an error condition in conjunction with a high load, asset monitoring application 101 compares, for each transformer, the primary voltage and the power flow voltage. If the primary voltage is below a threshold of the power flow voltage, and the condition is observed for multiple time intervals, then the capacitor bank is likely not turning on when needed. If the primary voltage is within a threshold of the power flow voltage, and the condition is observed for multiple time intervals, then the capacitor bank has a high likelihood of operating normally. If the primary voltage is above a threshold of the power flow voltage, then the power flow load estimation of the loading condition may be erroneous. In this case, the asset monitoring application 101 can reassess using a different loading condition.

To determine the existence of an error condition in conjunction with a low load, asset monitoring application 101 compares, for each transformer, the primary voltage and the power flow voltage. If the primary voltage is above a threshold of the power flow voltage, and the condition is observed for multiple time intervals, then the capacitor bank may have accidentally turned on. If the primary voltage is within a threshold of the power flow voltage, and the condition is observed for multiple time intervals, then the capacitor bank may have locked and or is not turning off when necessary. If the primary voltage is above a threshold of the power flow voltage then the power flow load estimation may be erroneous. In this case, the asset monitoring application 101 can reassess using a different loading condition or if all loading conditions have been considered, determine an error condition. If the primary and power flow voltages for a subset of the total transformers are above a threshold, but for other transformers, the voltages are not above a threshold, then asset monitoring application 101 can continue to check for other time intervals.

Responsive to determining that the capacitor bank is locked, not turning on when needed, or not turning off when needed, asset monitoring application 101 sends an alert to a control center. The alert indicates that the switched capacitor bank is malfunctioning.

Figure 5:
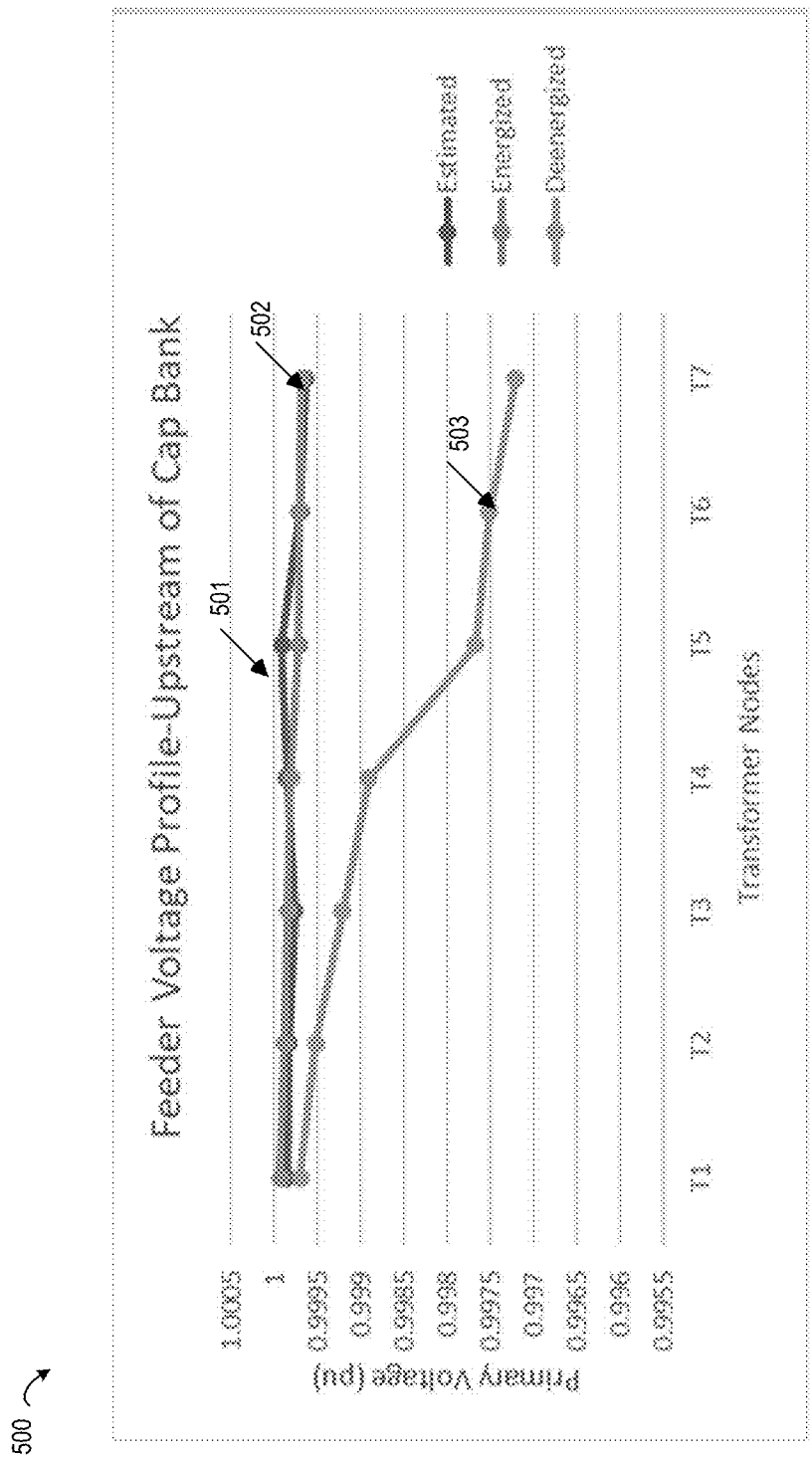
FIG. 5 depicts power flow results from a fixed capacitor bank in enabled and disabled states.

FIG. 5 depicts power flow results from a fixed capacitor bank in enabled and disabled states. FIG. 5 depicts graph 500. Graph 500 shows primary voltages of seven transformers T1-T7 that are distributed along a distribution line. Transformer T1 is closest to a substation, whereas transformer T7 is farthest from the feeder. As can be appreciated, as the transformers increase in distance from the feeder, the voltage at each subsequent transformer decreases slightly.

Graph 500 shows three plots. Plot 501 shows an estimated voltage at each transformer using AMI data. Plot 502 and 503 show voltages calculated using power flow. Plot 502 shows voltages at each transformer with the capacitor bank enabled. Plot 503 shows a voltage at each transformer with the capacitor bank disabled, i.e., effectively without a capacitor bank. As can be seen, plot 503 shows that the voltages decrease more rapidly as a function of distance from the feeder than plot 502.

As can be seen by comparing plot 501 with plot 502 and 503, if the estimated primary voltages depicted in plot 501 lie above the power flow voltages with capacitor bank enabled, as depicted by plot 502, then the capacitor bank is operating normally. If the estimated primary voltages depicted in plot 501 are close to or below the power flow voltages with the capacitor bank disabled, plot 503, then the capacitor bank has ceased to operate. As can be seen, the estimated primary voltage depicted in plot 501 follows a similar pattern to the power flow voltage with capacitor bank enabled, e.g., plot 502, which is a good indication that the capacitor bank is operating properly. Even though FIG. 5 depicts results for a fixed capacitor bank, in an aspect, results for a switched capacitor bank are similar.

Voltage Regulator

Asset monitoring application 101 can also determine the operational status of voltage regulators installed on a power distribution network. Voltage regulators are devices that step up or step down a power supply voltage such as a voltage from a distribution system feeder. In an example, a voltage regulator has multiple adjustable steps, each configurable to a different tap ratio. A tap ratio is the ratio of an input voltage to an output voltage.

In an aspect, a voltage regulator has a sensor installed that can measure the voltage and current. In response to a sensor measurement, the voltage regulator taps can be adjusted to maintain the output voltage at a desired level. Such sensor data can be integrated into the asset monitoring application 101.

Figure 6:
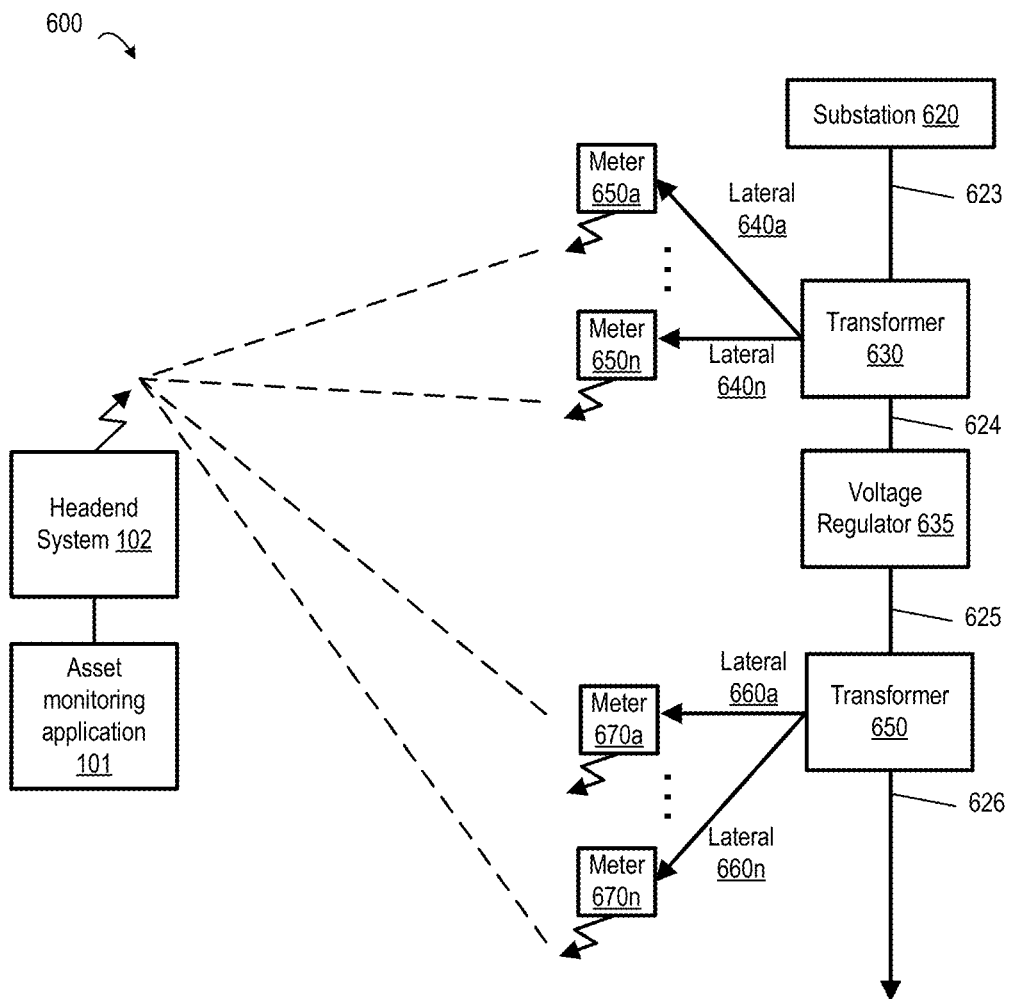
FIG. 6 illustrates an exemplary substation distribution line on a power distribution network that includes a voltage regulator.

FIG. 6 illustrates an exemplary substation distribution line on a power distribution network that includes a voltage regulator. Substation environment 600 includes one or more of substation transformer 620, distribution lines 623-626, transformer 630, laterals 640*a-n*, meters 650*a-n*, transformer 650, laterals 660*a-n*, meters 670*a-n*, and voltage regulator 635.

Voltage regulator 635 is located between transformers 630 and 650. Asset monitoring application 101 can determine the operating status of voltage regulator 635 by analyzing topology information that indicates the configuration and location of assets, distribution lines, and meters on a distribution network, and data received from one or more meters on the network such as voltage, power consumption, and other data that originated from meters 650*a-n* and 670*a-n*. For example, for calculating line losses, comparing the ratio of the primary voltage of transformer 630 and the primary voltage of transformer 650 provides a tap ratio setting of voltage regulator 635.

Substation transformer 620 provides power, via distribution line 623, to transformer 630, and via distribution lines 623 and 624 to voltage regulator 635. Transformer 630 provides power via a secondary winding to laterals 640*a-n*. Each lateral 640*a-n* can have one or more meters such as meters 650*a-n*.

Substation transformer 620 provides power, via distribution lines 623-625, to transformer 650. Transformer 650 provides power via a secondary winding to laterals 660*a-n*. Each lateral 660*a-n* has one or more meters such as meters 670*a-n*. Asset monitoring application 101 can use voltage and power measurements from meters 650*a-n* and 670*a-n* to determine the operation of voltage regulator 635.

Figure 7:
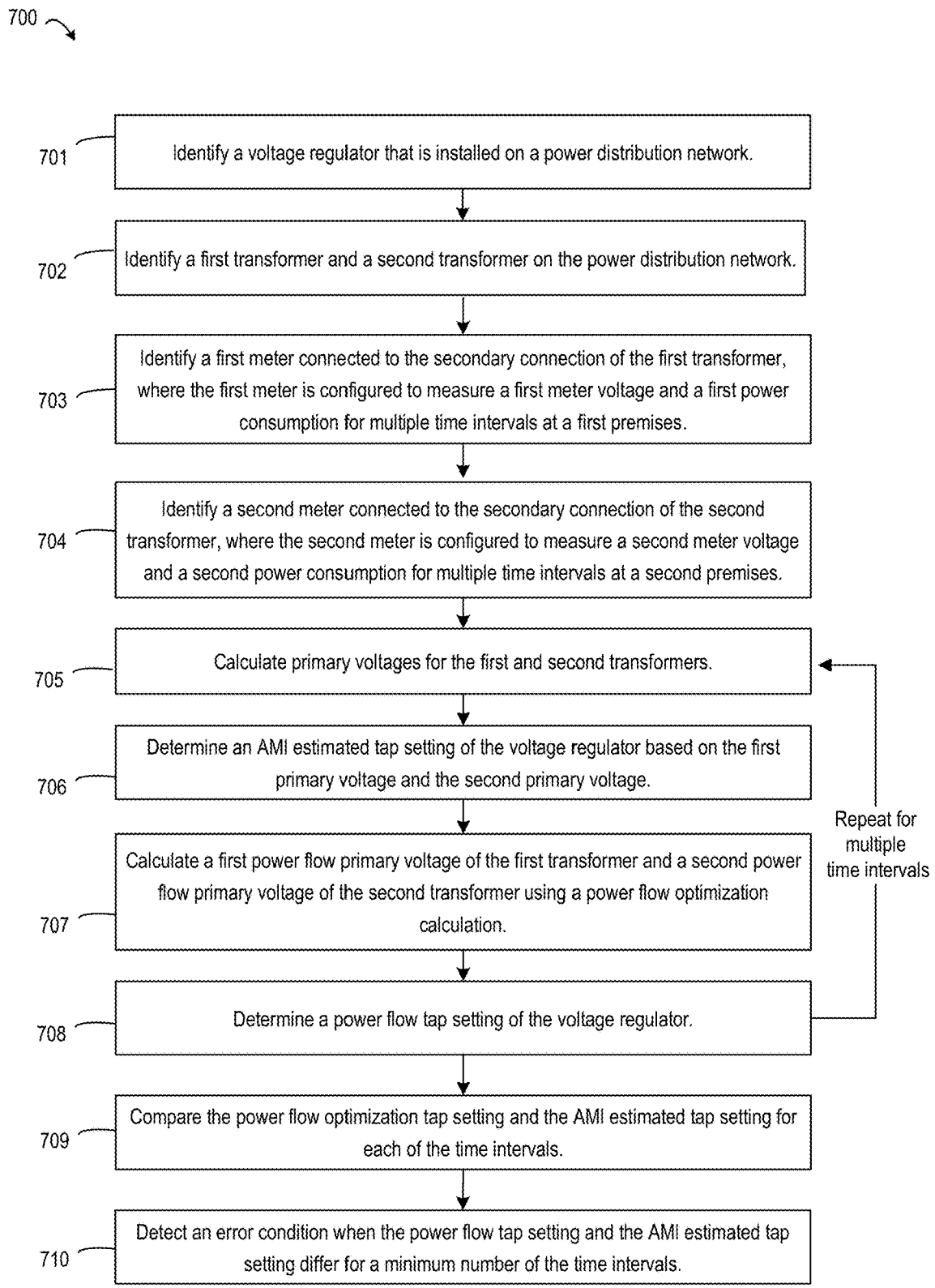
FIG. 7 is a flowchart illustrating an exemplary process for validating the operation of capacitor banks on an power distribution network.

FIG. 7 is a flowchart illustrating an exemplary process 700 for validating the operation of a voltage regulator on a power distribution network.

At block 701, asset monitoring application 101 identifies a voltage regulator that is installed on a power distribution network. For example, asset monitoring application 101 identifies voltage regulator 635.

At block 702, asset monitoring application 101 identifies a first transformer and a second transformer on the power distribution network. For example, asset monitoring application 101 identifies transformer 630 and transformer 650. As shown in FIG. 6, transformer 630 is connected upstream from voltage regulator 635 and transformer 650 is connected downstream from voltage regulator 635. Each of the first and second transformers have a primary and a secondary connection. In this example, the zone of operation for the voltage regulator includes the downstream transformers.

At block 703, asset monitoring application 101 identifies a first meter connected to the secondary connection of the first transformer. For example, asset monitoring application 101 identifies meter 650*a* that is connected to transformer 630 via lateral 640*a*. Meter 650*a* is configured to measure a first meter voltage and a first power consumption for multiple time intervals at a first premises.

At block 704, asset monitoring application 101 identifies a second meter connected to the secondary connection of the second transformer. For example, asset monitoring application 101 identifies meter 670*a* that is connected to transformer 650 via lateral 660*a*. Meter 670*a* is configured to measure a first meter voltage and a first power consumption for multiple time intervals at a first premises.

At block 705, asset monitoring application 101 calculates primary voltages for the first and second transformers. AMI parameters such as a primary voltage for the transformer 630 and a primary voltage for the transformer 650 represent values that are derived from actual measured AMI data. Asset monitoring application 101 determines primary voltages using the voltages measured at the endpoints, i.e., meters that connect to the transformers, and the topology of the network.

More specifically, asset monitoring application 101 uses voltage data obtained from meter 650a to determine the primary voltage of transformer 630 and meter data from meter 670a to determine the primary voltage of transformer 650. Asset monitoring application 101 calculates lateral line drop, i.e., voltage drop, for each lateral 640a and 660a. Additionally, asset monitoring application 101 determines a rated transformer loss and primary to secondary winding ratios of the primary voltages of transformers 630 and 650. An exemplary method is described in the section below entitled Calculation of primary transformer voltages using AMI meter data.

At block 706, asset monitoring application 101 determines an AMI estimated tap setting of the voltage regulator based on the first primary voltage and the second primary voltage. Asset monitoring application 101 calculates an AMI estimated tap setting using the AMI-estimated primary voltages, i.e., the voltages calculated at block 705.

At block 707, asset monitoring application 101 calculates a first power flow primary voltage for transformer 630 using a power flow optimization calculation and calculates a second power flow primary voltage of the transformer 650 using a power flow optimization calculation.

At block 708, asset monitoring application 101 determines a power flow tap setting of the voltage regulator. Power flow optimization provides example tap settings of the voltage regulator based on the loading conditions at the time and voltage regulator control settings such as time delay settings, controlled node location, and threshold values for triggering. The tap setting can be expressed in a ratio, e.g., 0.9, or 1.1.

Upon completion of the functions in block 706, asset monitoring application 101 can repeat the steps of blocks 705-708 until a threshold amount of data has been gathered.

At block 709, asset monitoring application 101 compares the power flow optimization tap setting and the AMI estimated tap setting for each of the time intervals. By comparing the power flow optimization tap setting and the AMI estimated tap settings, asset monitoring application 101 can determine whether voltage regulator 635 is operating as expected.

At block 710, asset monitoring application 101 detects an error condition when the power flow tap setting and the AMI estimated tap setting differ for a minimum number of the time intervals. In an example, asset monitoring application 101 determines an AMI estimated tap setting of the voltage regulator based on the first primary voltage and the second primary voltage by performing a series of steps. For example, the asset monitoring application 101 calculates a third primary voltage of the second transformer based on the first primary voltage of the first transformer and the power flow optimization tap setting. The third primary voltage is therefore based on both AMI and power flow calculations. The asset monitoring application compares the third primary voltage of the second transformer and the second primary voltage of the second transformer. If the third primary voltage of the second transformer and the second primary voltage of the second transformer is within a threshold, then asset monitor application 101 sets the AMI estimated tap setting equal to the power flow optimization tap setting.

If asset monitoring application 101 determines that a difference between the third primary voltage of the second transformer and the second primary voltage of the second transformer exceeds a threshold, asset monitoring application 101 can adjust a value of the power flow optimization tap setting to obtain an adjusted estimated tap setting and recalculate. Specifically, asset monitoring application calculates a fourth primary voltage of the second transformer based on the first primary voltage of the first transformer and the adjusted estimated tap setting, compares the fourth primary voltage of the second transformer and the second primary voltage of the second transformer. If asset monitoring application 101 determines that a difference between the fourth primary voltage and the second primary voltage are within the threshold, then asset monitoring application sets the AMI estimated tap setting equal to the adjusted estimated tap setting. In this manner, asset monitoring application 101 can iteratively determine the tap setting.

Asset monitoring application 101 can also determine different error conditions. For example, if the AMI estimated tap settings and the power flow optimization tap settings differ for a threshold number of time intervals, two error conditions are possible. First, if the power flow optimization tap settings are changing across the time intervals, but the AMI estimated tap settings are constant, asset monitoring application 101 determines that the taps in the voltage regulator are locked.

Second, if the power flow optimization tap settings are constant across the time intervals, but the AMI estimated tap settings are changing, asset monitoring application 101 determines an incorrect control logic error condition. A control logic error condition can be caused by a blown fuse (such as a fuse used for protection of the voltage regulator from transient faults), a failure of the instrument transformers in the voltage regulator that could result in incorrect sensing of the voltages at the regulator node, damage to the control system inside the voltage regulator used to provide set points based on the sensed voltage.

Asset monitoring application 101 can also determine whether the voltage regulation provided by the voltage regulator is sufficient for the given system (feeder) based on the current loading conditions. For example, if the impact of the voltage regulator is not observed in the entire downstream portion, then asset monitoring application 101 can identify solutions such as installing additional devices on the network.

For example asset monitoring application 101 obtains the tap setting values for the power flow optimization and the AMI calculations for a particular time interval. If the power flow tap optimization setting and the AMI tap setting are identical, then the asset monitoring application determines whether a threshold number of transformers downstream are showing estimated primary voltages below a minimum threshold. If the asset monitoring application 101 detects that additional transformers downstream have low voltages, then asset monitoring application 101 flags the transformers and repeats this process over multiple time intervals.

If asset monitoring application 101 determines that a threshold number of intervals are flagged, then the asset monitoring application can send an alert indicating that additional voltage regulating devices should be installed downstream from the substation.

Off-Load Tap Changing Distribution Transformer

Figure 8:
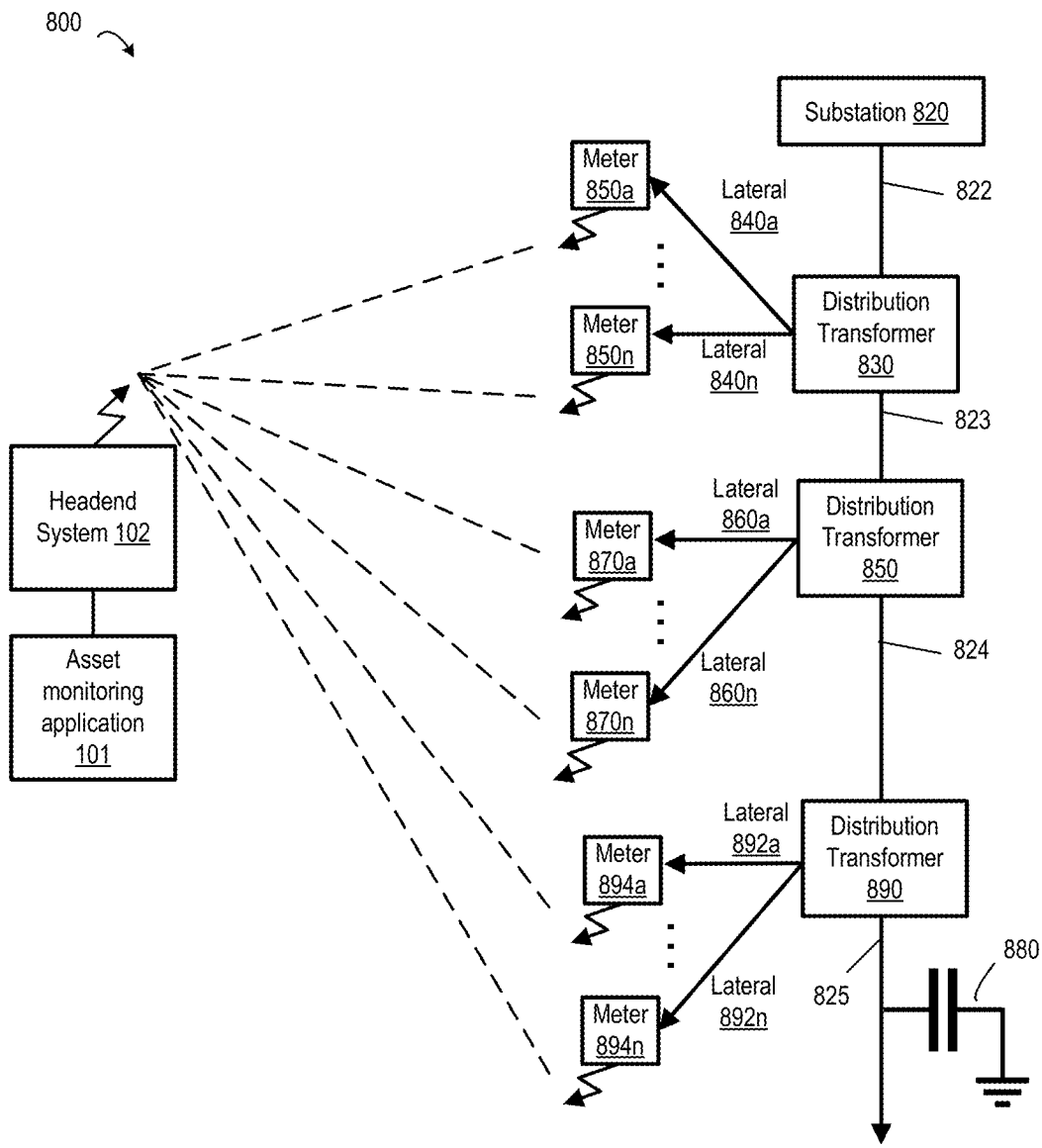
FIG. 8 illustrates an exemplary substation distribution line on a power distribution network that includes two distribution transformers.

Asset monitoring application 101 can also determine the operational status of distribution transformers installed on a power distribution network. Some distribution transformers have adjustable tap settings that allow for adjustment of the transformer windings such that different ratios of primary to secondary voltage can be obtained. FIG. 8 illustrates an exemplary substation distribution line on a power distribution network that includes two distribution transformers.

Substation environment 800 includes one or more of substation 820, distribution lines 822-825, distribution transformer 830, laterals 840*a-n*, meters 850*a-n*, distribution transformer 850, laterals 860*a-n*, meters 870*a-n*, distribution transformer 890, laterals 892*a-n*, meters 894*a-n*, and capacitor bank 880.

Substation 820 provides power, via distribution line 822, to distribution transformer 830, via distribution lines 822 and 823 to distribution transformer 850, and distribution lines 822-824 to distribution transformer 890. Distribution transformer 830 provides power via a secondary winding to laterals 840*a-n*. Each lateral 840*a-n* can have one or more meters such as meters 850*a-n*. Similarly, distribution transformer 850 provides power via a secondary winding to laterals 860*a-n*. Each lateral 860*a-n* can have one or more meters such as meters 870*a-n*. Distribution transformer 890 provides power via a secondary winding to laterals 892*a-n*. Each lateral 894*a-n* can have one or more meters such as meters 894*a-n*.

As described further herein, asset monitoring application 101 can determine an operating status of distribution transformers 830, 850, and 890 by analyzing topology information that indicates the configuration and location of assets, distribution lines, and meters on a distribution network, and data received from one or more meters on the network such as voltage, power consumption, and other data that originated from meters 850*a-n*, 870*a-n*, and meters 894*a-n*. In a similar manner, asset monitoring application 101 can determine the operating status of capacitor bank 880 and disambiguate whether a problematic operating condition is a result of capacitor bank 880 or distribution transformers 830, 850, and 890. For example, because distribution transformer 850 is located downstream from distribution transformer 830, the primary voltage of distribution transformer 850 may be different from the primary voltage of distribution transformer 830. Accordingly, the primary voltages of both distribution transformers 830 and 850 can together indicate how the voltage of distribution line 823 differs from the voltage of distribution line 822.

Figure 9:
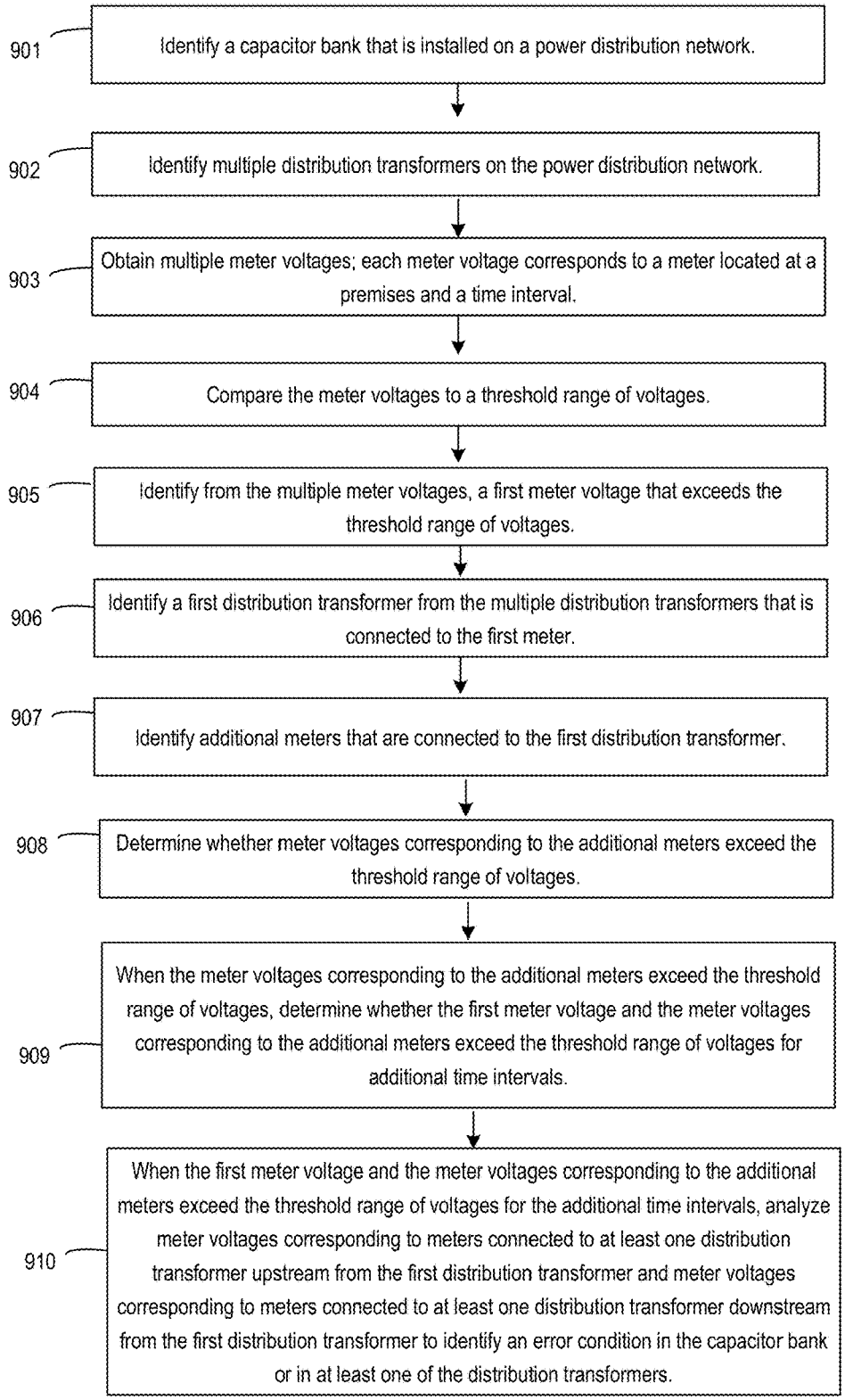
FIG. 9 is a flowchart illustrating an exemplary process for validating the operation of distribution transformers on an power distribution network.

FIG. 9 is a flowchart illustrating an exemplary process 900 for validating the operation of distribution transformers on a power distribution network.

At block 901, asset monitoring application 101 identifies a capacitor bank that is installed on a power distribution network. For example, asset monitoring application 101 identifies that capacitor bank 880 is located on the distribution network on distribution line 825.

At block 902, asset monitoring application 101 identifies multiple distribution transformers connected upstream from the capacitor bank. The asset monitoring application identifies distribution transformer 890, upstream from capacitor bank 880, distribution transformer 850, upstream from distribution transformer 890, and distribution transformer 830, located upstream from distribution transformer 850.

At block 903, asset monitoring application 101 obtains multiple meter voltages. Each meter voltage corresponds to a meter located at a premises and a time interval. Asset monitoring application 101 obtains one or more meter voltages from each of meters 850*a-n*, 870*a-n*, and 894*a-n*.

At block 904, asset monitoring application 101 compares the meter voltages to a threshold range of voltages. Asset monitoring application 101 compares the meter voltages obtained at block 903 with a threshold range of voltages. For example, meters located at a customers' premises have a particular range of permissible values, e.g., 105-115 V.

At block 905, asset monitoring application 101 identifies from the multiple meter voltages, a first meter voltage that exceeds the threshold range of voltages. In this example, asset monitoring application 101 determines that the first meter voltage, e.g., from meter 870*a*, exceeds the threshold range of voltages.

At block 906, asset monitoring application 101 identifies a first distribution transformer from the multiple distribution transformers that is connected to the first meter. The asset monitoring application identifies that meter 870*a* is fed from distribution transformer 850, for example using a topology mapping.

At block 907, asset monitoring application 101 identifies additional meters that are connected to the first distribution transformer. In an example, the asset monitoring application identifies that meters 870*b* and 870*c* are connected, via laterals 860*b* and 860*c* to distribution transformer 850.

At block 908, asset monitoring application 101 determines whether meter voltages corresponding to the additional meters exceed the threshold range of voltages. The asset monitoring application identifies that the voltages from meters 870*b* and 870*c* exceed the threshold range of voltages.

At block 909, when the meter voltages corresponding to the additional meters exceed the threshold range of voltages, asset monitoring application 101 determines whether the first meter voltage and the meter voltages corresponding to the additional meters exceed the threshold range of voltages for additional time intervals. More specifically, asset monitoring application 101 continues to analyze the meter voltages for additional time periods and determines whether the meter voltages exceed the threshold range for a particular number of time periods. In this manner, asset monitoring application 101 can ignore one-off results.

At block 910, when the first meter voltage and the meter voltages corresponding to the additional meters exceed the threshold range of voltages for the additional time intervals, asset monitoring application 101 analyzes meter voltages corresponding to meters connected to at least one distribution transformer upstream from the first distribution transformer and meter voltages corresponding to meters connected to at least one distribution transformer downstream from the first distribution transformer to identify an error condition in the capacitor bank or in at least one of the distribution transformers. Asset monitoring application 101 can isolate an error condition in a distribution transformer or a capacitor bank.

Continuing the above example, asset monitoring application 101 analyzes meters 850*a-n* connected via laterals 840*a-n* to distribution transformer 830 and meters 894*a-n*, connected via laterals 892*a-n* to distribution transformer 890. In this manner, asset monitoring application 101 can identify an error condition. In the case that the meter voltages corresponding to meters connected to at least one distribution transformer upstream from the first distribution transformer, e.g., distribution transformer 830, and meter voltages corresponding to meters connected to at least one distribution transformer downstream e.g., distribution transformer 890 from the first distribution transformer, exceed the threshold range of values, then determining that the error condition is associated with the capacitor bank. In this case, distribution transformer 850 is not identified as having an error.

In the case that the capacitor bank 880 is not included or that many of the transformers are flagged because of voltages that exceed the threshold range of values are not located in a zone of maximum impact of the capacitor bank, then at least the first transformer may have an incorrectly set tap ratio that is causing the out-of-bounds results. A zone of maximum impact can be defined as the nodes close to the capacitor bank, such as upstream or downstream from the capacitor bank.

Additionally, when the meter voltages corresponding to meters connected to at least one distribution transformer upstream from the first distribution transformer, e.g., distribution transformer 830, and meter voltages corresponding to meters connected to at least one distribution transformer downstream, e.g., distribution transformer 890, from the first distribution transformer 870 are within the threshold range of values, then determining that the error condition is associated with the first distribution transformer.

Figure 10:
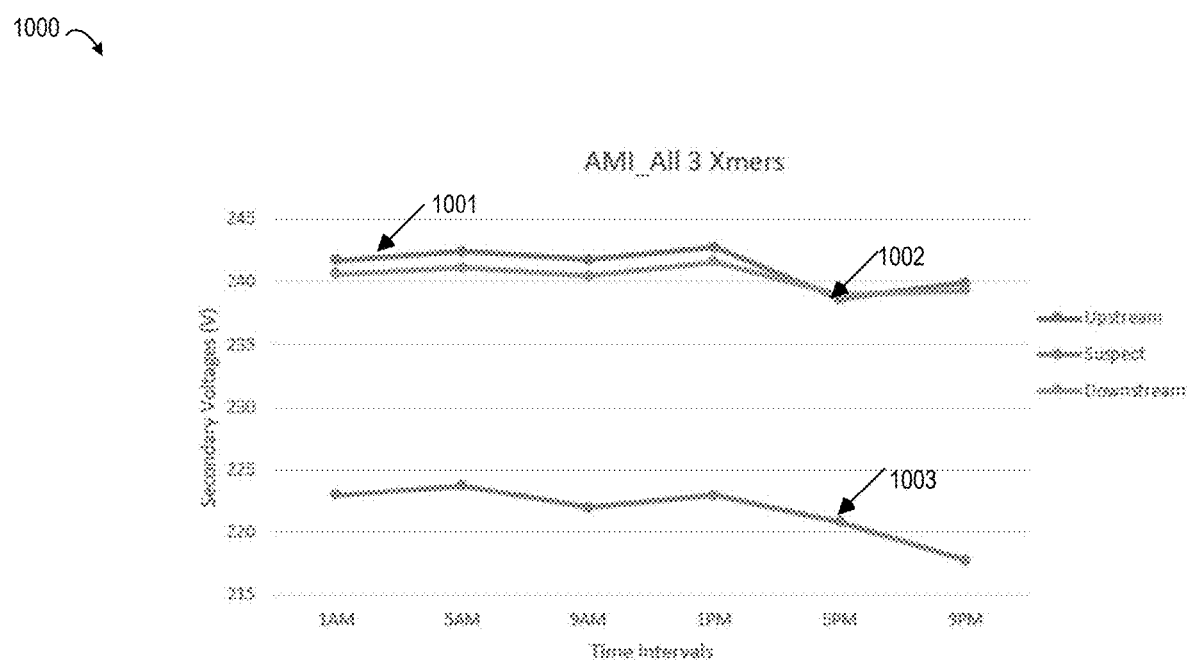
FIG. 10 depicts power flow results from transformers installed on a distribution line.

FIG. 10 depicts power flow results from transformers installed on a distribution line. FIG. 10 depicts graph 1000. Graph 1000 shows primary voltages of three transformers that are distributed along a distribution line over the course of a day. As can be appreciated, as the transformers increase in distance from the feeder, the voltage at each subsequent transformer decreases slightly. Additionally, some fluctuations are expected due to varying load.

Graph 1000 shows three plots. Plot 1002 shows a voltage of a transformer that asset monitoring application 101 considers to be suspect, or potentially broken. Plots 1001 and 1003 show voltages of transformers located immediately upstream and downstream, respectively, from the suspect transformer. As can be seen, the voltage of the suspect transformer is approximately 20 Volts lower than the upstream and downstream transformers.

On-Load Tap Changing Substation Transformer

Asset monitoring application 101 can determine the operational status of tap changing substation transformers that are under a load.

Figure 11:
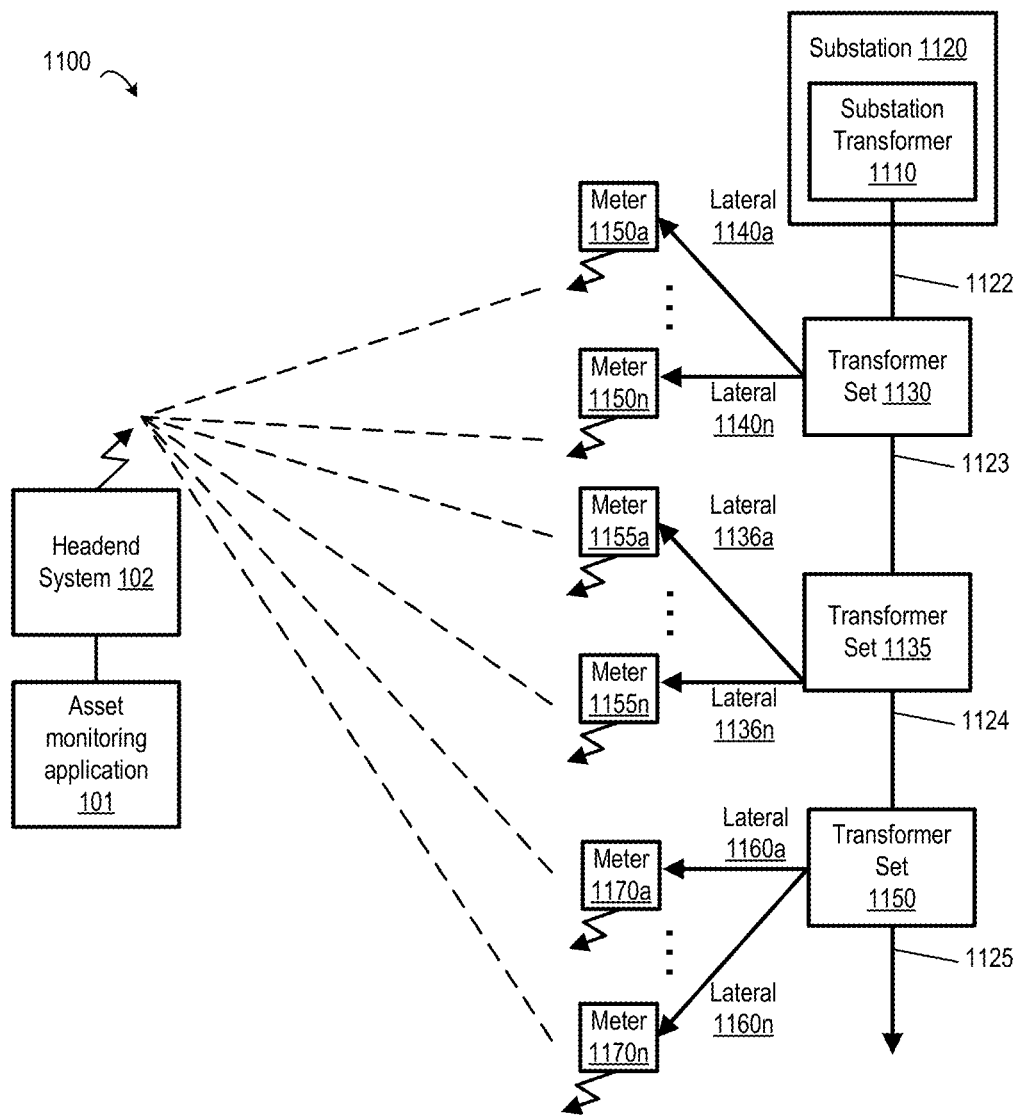
FIG. 11 illustrates an exemplary substation distribution line on a power distribution network that includes an on-load distribution transformer.

FIG. 11 illustrates an exemplary substation distribution line on a power distribution network that includes an on-load substation transformer. Substation environment 1100 includes one or more of substation 1120, substation transformer 1110, distribution lines 1122-1125, transformer set 1130, laterals 1140*a-n*, meters 1150*a-n*, transformer set 1135, laterals 1136*a-n*, meters 1155*a-n*, transformer set 1150, laterals 1160*a-n*, and meters 1170*a-n*.

Transformer sets are groups of transformers that are grouped into sets for the purposes of power flow or AMI analysis. Grouping can be performed based on physical proximity or another characteristic. Transformer sets 1130, 1135, and 1150 each include one or more transformers. Each transformer within a set connects to one or more laterals.

Substation 1120 provides power via distribution line 1122 to the transformers in transformer set 1130, via distribution lines 1122 and 1124 to the transformers in transformer set 1135, and via distribution lines 1122-1124 to the transformers in transformer set 1150. The transformers in transformer set 1130 provide power via a secondary winding to laterals 1140*a-n*. Each lateral 1140*a-n* can have one or more meters such as meters 1150*a-n*.

Similarly, the transformers in transformer set 1135 provide power via a secondary winding to laterals 1136*a-n*. Each lateral 1136*a-n* can have one or more meters such as meters 1155*a-n*. The transformers in transformer set 1150 provide power via a secondary winding to laterals 1160*a-n*. Each lateral 1160*a-n* can have one or more meters such as meters 1170*a-n*.

Asset monitoring application 101 determines the operating status of transformers in transformer sets 1130, 1135, and 1150 by analyzing topology information that indicates the configuration and location of assets, distribution lines, and meters on a distribution network, and data received from one or more meters on the network such as voltage, power consumption, and other data that originated from meters 1150*a-n*, 1155*a-n*, and 1170*a-n*.

Figure 12:
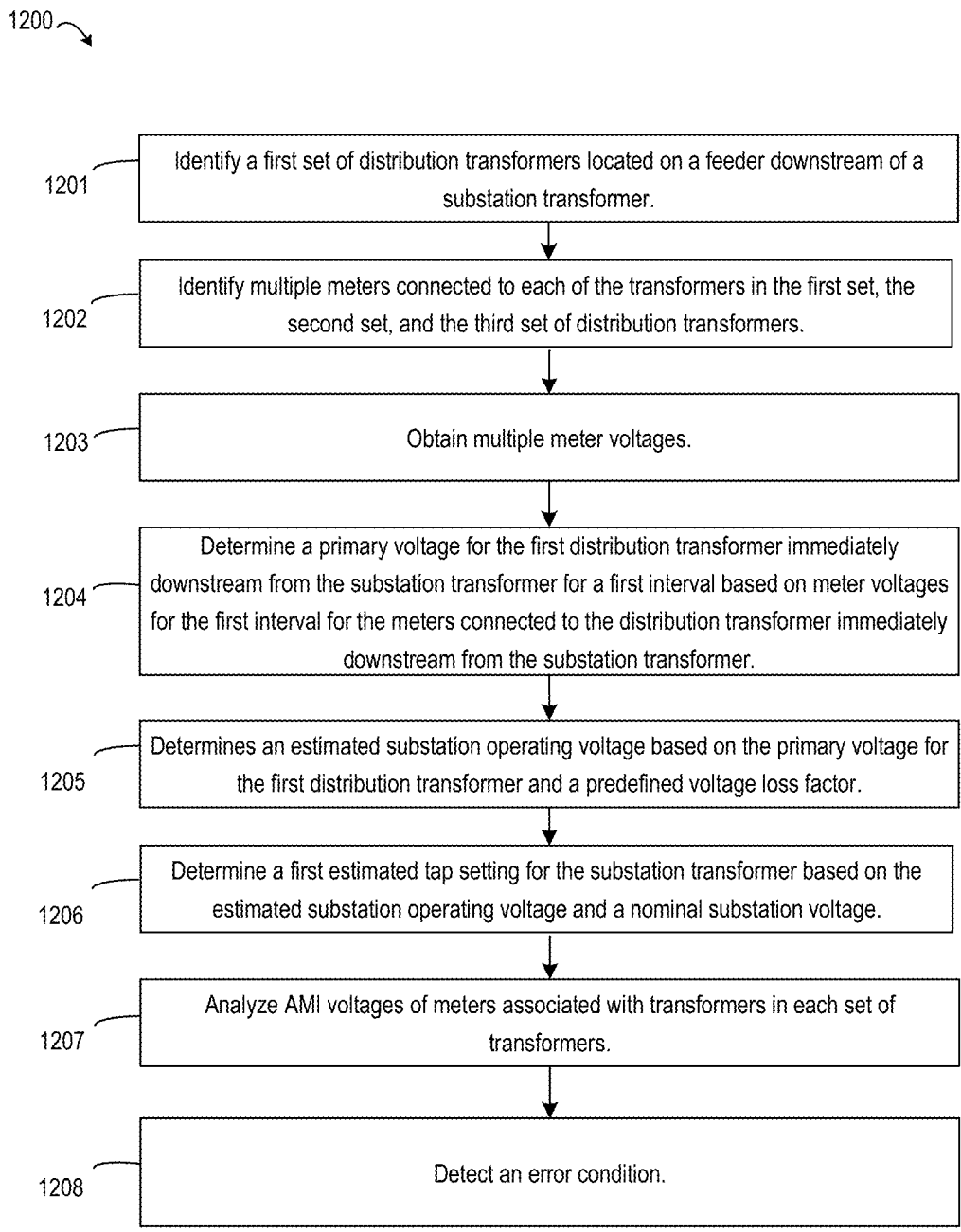
FIG. 12 is a flowchart illustrating an exemplary process for validating operation of an on-load substation transformer on a power distribution network.

FIG. 12 is a flowchart illustrating an exemplary process 1200 for validating an operation of an on-load substation transformer on a power distribution network.

At block 1201, asset monitoring application 101 identifies a first set of distribution transformers located on a feeder downstream of a substation transformer. As shown in FIG. 10, transformer set 1130 is located immediately downstream of substation transformer 1110. Transformer set 1135 is located downstream of transformer set 1130 at intermediate locations on the feeder. Transformer set 1150 is located downstream of the second set of distribution transformers at remote downstream locations on the feeder.

At block 1202, asset monitoring application 101 identifies multiple meters connected to each of the transformers in the first set, the second set, and the third set of distribution transformers. Continuing the example, asset monitoring application 101 identifies meters 1150*a-n*, 1055*a-n*, and 1070*a-n*.

At block 1203, asset monitoring application 101 obtains multiple meter voltages. Asset monitoring application obtains meter voltages for meters 1150*a-n*, 1055*a-n*, and 1070*a-n*. Asset monitoring application 101 measures the voltages over multiple time intervals.

At block 1204, asset monitoring application 101 determines a primary voltage for the first distribution transformer immediately downstream from the substation transformer 1110 for a first interval based on meter voltages for the first interval for the meters connected to the first distribution transformer. Continuing the example, asset monitoring application 101 determines a primary voltage for transformer set 1130, e.g. on distribution line 1122.

At block 1205, asset monitoring application 101 determines an estimated substation operating voltage based on the primary voltage for the first distribution transformer and a predefined voltage loss factor. The predefined voltage loss factor provides an estimate of the voltage loss between the substation transformer 1110 and the first distribution transformer. Asset monitoring application 101 determines the output voltage of substation transformer 1110. In an aspect, asset monitoring application 101 can also use SCADA (Supervisory control and data acquisition) data, if available, to obtain the substation operating voltage.

At block 1206, asset monitoring application 101 determines a first estimated tap setting for the substation transformer based on the estimated substation operating voltage and a nominal substation voltage. Based on the estimated substation voltage calculated at block 1205, and a nominal substation voltage, i.e., the nameplate voltage of the substation transformer, asset monitoring application 101 determines a first estimated tap setting for substation transformer 1110. The ratio of the estimated substation voltage and the nominal substation voltage provides the tap setting.

At block 1207, asset monitoring application 101 analyzes AMI voltages of meters associated with transformers in each set of transformers.

At block 1208, asset monitoring application 101 detects an error condition. Asset monitoring application 101 can perform a series of steps in order to determine an error condition. For example, asset monitoring application 101 can determine whether the AMI voltages of any meter in any of the transformer sets is outside the permissible ANSI bounds. In an example, ANSI bounds can be 95%-105% of the nominal voltage. Asset monitoring application 101 flags the transformer associated with, e.g., upstream from, the meter. Asset monitoring application 101 analyzes the meter voltages for multiple time intervals. Responsive to determining that none of the transformers are flagged, asset monitoring application determines a high possibility that the on load tap-changing transformer is operating normally.

Conversely, if a single transformer is flagged for a threshold number of intervals then asset monitoring application 101 checks whether the estimated substation taps calculated at block 1206 are changing across the time intervals. If the estimated substation taps appear to be changing, the asset monitoring application 101 determines that the on-load tap changing transformer might be operating with an incorrect logic. If the estimated substation taps are not changing, then the taps could have been locked.

Exemplary Computing Devices Used for Asset Monitoring

FIG. 13 illustrates an exemplary computing device used for an asset-monitoring application, according to certain aspects of the present disclosure. Any suitable computing system may be used for performing the operations described herein. The depicted example of a computing device 1300 includes a processor 1302 communicatively coupled to one or more memory devices 1304. The processor 1302 executes computer-executable program code 1330 stored in a memory device 1304, accesses data 1320 stored in the memory device 1304, or both. Examples of the processor 1302 include a microprocessor, an application-specific integrated circuit ("ASIC"), a field-programmable gate array ("FPGA"), or any other suitable processing device. The processor 1302 can include any number of processing devices or cores, including a single processing device. The functionality of the computing device may be implemented in hardware, software, firmware, or a combination thereof.

The memory device 1304 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language.

The computing device 1300 may also include a number of external or internal devices, such as input or output devices. For example, the computing device 1300 is shown with one or more input/output ("I/O") interfaces 1308. An I/O interface 1308 can receive input from input devices or provide output to output devices. One or more busses 1306 are also included in the computing device 1300. The bus 1306 communicatively couples one or more components of a respective one of the computing device 1300.

The computing device 1300 executes program code 1330 that configures the processor 1302 to perform one or more of the operations described herein. For example, the program code 1330 causes the processor to perform the operations described in FIG. 3, 4, 7, 9, or 12.

The computing device 1300 also includes a network interface device 1310. The network interface device 1310 includes any device or group of devices suitable for establishing a wired or wireless data connection to one or more data networks. The network interface device 1310 may be a wireless device and have an antenna 1314. The computing device 1300 can communicate with one or more other computing devices implementing the computing device or other functionality via a data network using the network interface device 1310.

The computing device 1300 can also include a display device 1312. Display device 1312 can be a LCD, LED, touch-screen or other device operable to display information about the computing device 1300. For example, information could include an operational status of the computing device, network status, etc.

Calculation of Primary Transformer Voltages Using AMI Meter Data

For example, the lateral line drop can be calculated in the following manner. The asset monitoring application 101 obtains the meter's consumption (kW) and voltage (kV). asset monitoring application 101 calculates the load current using a fixed power factor of 0.94 or 0.95.

$$\text{Reactive Power (VA)} = \frac{\text{power (W)}}{\text{power factor}}$$

$$\text{Load Current (A)} = \frac{\text{Reactive Power}}{\text{power}}$$

In order to calculate the voltage line drop, asset monitoring application 101 obtains the length L of a secondary line that connects the meter to the secondary winding of the transformer and its corresponding resistance r and inductance r.

$$\text{Voltage drop} = |(r+jx)*L*A|$$

To calculate the transformer voltage-drop, asset monitoring application 101 uses the total secondary current from the transformer and the total reactive load on the transformer. Asset monitoring application 101 obtains the rated transformer winding loss and no-load loss from topology information or asset information such as from a utility database.

Transformer total loss (W) =

Transformer load loss (W) + Transformer loss without load (W)

Where, Transformer Load Loss (W) =

$$\left[\frac{kVA_{Load}}{Xmer \text{ Rated } kVA}\right]^2 * \text{Rated Transformer Winding Loss}$$

So, the total transformer loss (in VA) when taking a standard power factor becomes $$\text{Transformer Total Loss (VA)} = \frac{\text{Transformer Load Loss (W)}}{\text{Power Factor}}$$

Asset monitoring application 101 calculates the total transformer voltage drop:

$$\Delta V_{xmer} = \frac{\text{Transformer Total Loss (VA)}}{\text{Total Current}(A_{total})}$$

Asset monitoring application 101 calculates the transformer node primary voltage by calculating the secondary voltage of the transformer by summing the line drop voltage, the transformer loss voltage and the voltage of the load, i.e., at the meter.

Using the transformer turns ratio and secondary voltage, asset monitoring application 101 calculates the primary voltage in the following manner:

$$V_{primary(AMI)} = \text{Secondary voltage} * \frac{N_{primary}}{N_{secondary}}$$

where $N_{primary}$ and $N_{secondary}$ refer to the number of turns on the primary and secondary windings respectively.

Preprocessing of AMI data

In an aspect, raw AMI data can be preprocessed. Raw AMI data obtained from the meter headend system can contain outlier data points such as voltage values impacted due to outages, missing voltage reads, or missing consumption reads. If considered, such data could erroneously impact the AMI-based results. Accordingly, the asset monitoring application 101 can perform a sequence of additional steps to minimize the impact of erroneous AMI data. For example, the asset monitoring application 101 can ignore AMI data for meters that show voltages below a threshold such as 100 Volts. Alternatively, the asset monitoring application 101 can ignore voltages below a threshold ratio, e.g., 0.85 of the expected voltage or above a threshold ratio of the expected voltage, e.g., 1.15. Further, the asset monitoring application 101 can ignore readings from meters that have missing voltage reads for the selected intervals that are not factored in for the analysis. Additionally, asset monitoring application 101 can average an AMI meter voltage for a period of time subsequent to a transformer tap change.

GENERAL CONSIDERATIONS

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for determining an operating status of an asset within a power distribution network, the method comprising:
   identifying a zone of operation for an asset under evaluation;
   identifying a plurality of transformers in the zone of operation;
   identifying a plurality of meters connected to the transformers, wherein each meter is connected to one of the transformers;
   obtaining meter voltages for the plurality of meters over a plurality of intervals;
   determining a primary voltage for at least one transformer based on the meter voltages over the intervals;
   determining a power flow primary voltage for the at least one transformer using a power flow calculation based on electrical characteristics of the asset, a location of the asset within a network topology of the power distribution network, and a current electrical load;
   comparing the power flow primary voltage and the primary voltage across multiple time intervals; and
   determining, based on the comparison, an operational status of the asset.

2. The method of claim 1, further comprising, responsive to determining that the operational status indicates that the asset is not operating, sending an alert to a control center.

3. The method of claim 1, wherein the asset is one of (i) a capacitor bank, (ii) a switched capacitor bank, (iii) a voltage regulator, (iv) a distribution transformer, or (v) a substation transformer.

4. A method for determining an operating status of a voltage regulator, the method comprising:
   identifying a voltage regulator that is installed on a power distribution network;
   identifying a first transformer and a second transformer on the power distribution network, wherein the first transformer is connected upstream from the voltage regulator and the second transformer is connected downstream from the voltage regulator, wherein the first and second transformers each comprise a primary and a secondary connection;
   identifying a first meter connected to the secondary connection of the first transformer, wherein the first meter is configured to measure a first meter voltage and a first power consumption for a plurality of time intervals at a first premises;
   identifying a second meter connected to the secondary connection of the second transformer, wherein the second meter is configured to measure a second meter voltage and a second power consumption for the plurality of time intervals at a second premises;
   for each time interval of the plurality of time intervals:
      calculating, a first primary voltage of the first transformer from the first meter voltage and the first power consumption;
      calculating, a second primary voltage of the second transformer from the second meter voltage and the second power consumption;
      determining an AMI estimated tap setting of the voltage regulator based on the first primary voltage and the second primary voltage;
      calculating, a first power flow primary voltage of the first transformer using a power flow calculation;
      calculating, a second power flow primary voltage of the second transformer using the power flow calculation;
      determining a power flow tap setting of the voltage regulator; and
   comparing the power flow tap setting and the AMI estimated tap setting for each of the time intervals; and
   detecting an error condition when the power flow tap setting and the AMI estimated tap setting differ for a minimum number of the time intervals.

5. The method of claim 4, further comprising detecting that one or more taps of the voltage regulator may be locked responsive to determining that the AMI estimated tap setting is constant over a minimum number of time intervals.

6. The method of claim 4, wherein determining an AMI estimated tap setting of the voltage regulator based on the first primary voltage and the second primary voltage comprises:
   calculating a third primary voltage of the second transformer based on the first primary voltage of the first transformer and the power flow tap setting;
   comparing the third primary voltage of the second transformer and the second primary voltage of the second transformer;

when a difference between the third primary voltage of the second transformer and the second primary voltage of the second transformer is within a threshold, then setting the AMI estimated tap setting equal to the power flow tap setting; and when a difference between the third primary voltage of the second transformer and the second primary voltage of the second transformer exceeds the threshold, then adjusting a value of the power flow tap setting to obtain an adjusted estimated tap setting, calculating a fourth primary voltage of the second transformer based on the first primary voltage of the first transformer and the adjusted estimated tap setting, comparing the fourth primary voltage of the second transformer and the second primary voltage of the second transformer, and when a difference between the fourth primary voltage and the second primary voltage is within the threshold, then setting the AMI estimated tap setting equal to the adjusted estimated tap setting.

7. The method of claim 4, wherein detecting an error condition when the power flow tap setting and the AMI estimated tap setting differ for a minimum number of time intervals comprises:
   determining whether the power flow tap setting differs across the time intervals;
   when the power flow tap setting differs across the time intervals, then identifying a tap lock error condition; and
   when the power flow tap setting is constant across the time intervals, then identifying a control error condition.

8. The method of claim 4, further comprising determining that the power flow tap setting and the AMI estimated tap setting are constant for the minimum number of the time intervals and detecting that additional devices should be added downstream from the voltage regulator by determining that the first power flow primary voltage is within a threshold of the first primary voltage and the second power flow primary voltage is within a threshold of the second primary voltage.

9. A method for determining an operating status of a distribution transformer, the method comprising:
   identifying a capacitor bank that is installed on a power distribution network;
   identifying a plurality of distribution transformers connected upstream from the capacitor bank;
   obtaining a plurality of meter voltages, wherein each meter voltage corresponds to a meter located at a premises and a time interval;
   comparing the meter voltages to a threshold range of voltages;
   identifying from the plurality of meter voltages, a first meter voltage that exceeds the threshold range of voltages, wherein the first meter voltage corresponds to a first meter;
   identifying a first distribution transformer from the plurality of distribution transformers that is connected to the first meter;
   identifying additional meters that are connected to the first distribution transformer;
   determining whether meter voltages corresponding to the additional meters exceed the threshold range of voltages;
   when the meter voltages corresponding to the additional meters exceed the threshold range of voltages, determining whether the first meter voltage and the meter voltages corresponding to the additional meters exceed the threshold range of voltages for additional time intervals; and
   when the first meter voltage and the meter voltages corresponding to the additional meters exceed the threshold range of voltages for the additional time intervals, analyzing meter voltages corresponding to meters connected to at least one distribution transformer upstream from the first distribution transformer and meter voltages corresponding to meters connected to at least one distribution transformer downstream from the first distribution transformer to identify an error condition in the capacitor bank or in at least one of the distribution transformers.

10. The method of claim 9, wherein analyzing meter voltages corresponding to meters connected to at least one distribution transformer upstream from the first distribution transformer and meter voltages corresponding to meters connected to at least one distribution transformer downstream from the first distribution transformer comprises:
   when the meter voltages corresponding to meters connected to at least one distribution transformer upstream from the first distribution transformer and meter voltages corresponding to meters connected to at least one distribution transformer downstream from the first distribution transformer exceed the threshold range of voltages, then determining that the error condition is associated with the capacitor bank.

11. The method of claim 9, wherein analyzing meter voltages corresponding to meters connected to at least one distribution transformer upstream from the first distribution transformer and meter voltages corresponding to meters connected to at least one distribution transformer downstream from the first distribution transformer comprises:
   when the meter voltages corresponding to meters connected to at least one distribution transformer upstream from the first distribution transformer and meter voltages corresponding to meters connected to at least one distribution transformer downstream from the first distribution transformer are within the threshold range of voltages, then determining that the error condition is associated with the first distribution transformer.

\* \* \* \* \*